US005502893A

United States Patent [19]
Endoh et al.

[11] Patent Number: 5,502,893
[45] Date of Patent: Apr. 2, 1996

[54] METHOD OF MAKING A PRINTING WIRING BOARD

[75] Inventors: Shuhichi Endoh, Fujisawa; Motoi Suga, Kanagawa, both of Japan

[73] Assignee: International Business Machines Corporation, Armonk, N.Y.

[21] Appl. No.: 299,725

[22] Filed: Sep. 1, 1994

Related U.S. Application Data

[62] Division of Ser. No. 132,020, Oct. 5, 1993, Pat. No. 5,374,788.

[30] Foreign Application Priority Data

Oct. 9, 1992 [JP] Japan ...................... 4-271303

[51] Int. Cl.⁶ .............................. H05K 3/42; H05K 3/44
[52] U.S. Cl. .................... 29/852; 29/847; 427/97
[58] Field of Search ........................... 29/830, 846, 847, 29/852, DIG. 12, DIG. 16; 174/266; 156/661.1; 361/748; 427/96, 97, 98; 216/18

[56] References Cited

U.S. PATENT DOCUMENTS

| | | | |
|---|---|---|---|
| 3,334,395 | 3/1967 | Cook et al. | 29/852 |
| 3,673,680 | 7/1972 | Tanaka et al. | 29/852 X |
| 3,855,692 | 12/1974 | Dugan | 29/852 |
| 3,934,335 | 1/1976 | Nelson | 427/96 X |
| 4,015,987 | 4/1977 | Garry | 29/847 |
| 5,153,986 | 10/1992 | Brauer et al. | 29/830 X |
| 5,160,579 | 11/1992 | Larson | 156/661.1 |

FOREIGN PATENT DOCUMENTS

| | | |
|---|---|---|
| 61-1131552 | 6/1986 | Japan . |
| 62-48089 | 3/1987 | Japan . |
| 62-132392 | 6/1987 | Japan . |
| 63-98179 | 4/1988 | Japan . |
| 434859 | 12/1992 | Japan ...................... 29/852 |
| 5145221 | 6/1993 | Japan ...................... 29/852 |

OTHER PUBLICATIONS

"Plating Through–Holes" IBM Technical Disclosure Bulletin, vol. 9, No. 10, Mar. 1967, pp. 1255–1256.

*Primary Examiner*—Peter Vo
*Attorney, Agent, or Firm*—Lawrence R. Fraley

[57] ABSTRACT

A metal cored printed wiring board and a manufacturing method therefor, in which an organic non-conductive layer will not separate from the metal core even in an environment of high temperature and high humidity since both the metal core and the organic non-conductive layer are firmly adhered. An organic non-conductive layer is formed over the metal core (e.g., of aluminum) with a metal plated layer (e.g., nickel) therebetween for protecting the metal core. A metal oxide layer is also used for enhancing adhesive force. By utilizing such a metal oxide layer, it is possible to more effectively prevent the organic non-conductive layer from separating from the plated layer (and thus the metal core). Further, the protecting metal plated layer can protect the metal core from erosion caused by contact with a strong alkali solution, etc. as may be used in a process of forming the metal oxide layer. Still further, copper plating inside the through hole can be performed easily.

8 Claims, 7 Drawing Sheets

METHOD OF MAKING A PRINTING WIRING BOARD

This is a divisional of application Ser. No. 08/132,020 filed on Oct. 5, 1993 now U.S. Pat. No. 5,374,788.

TECHNICAL FIELD

The present invention relates to printed wiring boards and particularly to such boards having metallic cores.

BACKGROUND OF THE INVENTION

Printed wiring boards are known which have a core made of organic insulating materials (e.g., fiberglass reinforced epoxy resin), and even those where the core is of metallic material. Of these boards, a board whose core is made of metal, especially an effective heat conductor such as aluminum, is excellent in heat radiation, mechanical strength, etc. and is suitable for high density packaging. A known metal cored board having a core made of aluminum (Al), as disclosed in, for example, Japanese Published Unexamined Patent Applications (PUPAs) No. 61-131552, No. 62-132392, and No.63-98179, generally has such construction that an organic, non-conductive layer is formed over the aluminum core and a wiring layer is formed over the organic non-conductive layer. It is assumed that aluminum oxide is usually formed over the surface of the aluminum core.

In such known constructions, since the adhesive force between the aluminum core and the organic non-conductive layer is insufficient, the organic non-conductive layer may become separated from the aluminum core, particularly in an environment of high temperature and high humidity. Further, in such known constructions, when copper plating for a conductive path is provided on the inner surface of a pierced bore (for a through hole) formed in the aluminum core, a problem results wherein the aluminum core is eroded by a strong alkali solution typically used in the process of copper plating. Still further, one structure in JA PUPA No. 62-48089 shows a metal cored board in which a plated layer made of easily solderable metal (such as nickel) is formed over the metal core (such as aluminum) and an electrically insulating layer is formed over the plated layer through an adhesive layer. However, since the adhesive is of an organic material family and the adhesive force between the plated and electrically insulating layers is not necessarily sufficient, the organic non-conductive layer may separate from the aluminum core in an environment of high temperature and high humidity in the same manner as in the other known constructions described above.

It is believed that a printed wiring board and method of making same that will overcome the above and related disadvantages would constitute a significant advancement in the art.

DISCLOSURE OF THE INVENTION

It is, therefore, a primary object of the present invention to enhance the art of printed wiring (circuit) boards.

It is a particular object of the present invention to provide a metal cored printed wiring board and a manufacturing method therefor, in which an organic non-conductive layer does not separate from the metal core even in an environment of relatively high temperature and high humidity since both the metal core and the organic non-conductive layer are firmly adhered.

To attain these and other objects, the present invention is intended to form an organic non-conductive layer over a metal core (e.g., of aluminum) including using a metal plated layer for protection of the metal core and a metal oxide layer for enhancing adhesive force. By utilizing the metal oxide layer for enhancing adhesive force, it is possible to more effectively prevent the organic non-conductive layer from core separation in comparison to the situation where adhesive of a series of organic resin materials is utilized, as mentioned above. Further, use of a metal plated layer can serve to protect the metal core from erosion caused by contact with a strong alkali solution, etc. as may be used in a process of forming the metal oxide layer used for enhancing adhesive force. Still further, since the metal plated layer protects the metal core from erosion by a strong alkali solution such as may be used during the copper plating of the formed through hole, the copper plating inside the through hole can be performed relatively easily.

BEST MODE FOR CARRYING OUT THE INVENTION

For a better understanding of the invention, together with other objects, advantages and capabilities thereof, reference is made to the following disclosure in connection with the aforementioned drawings.

Figure 1:
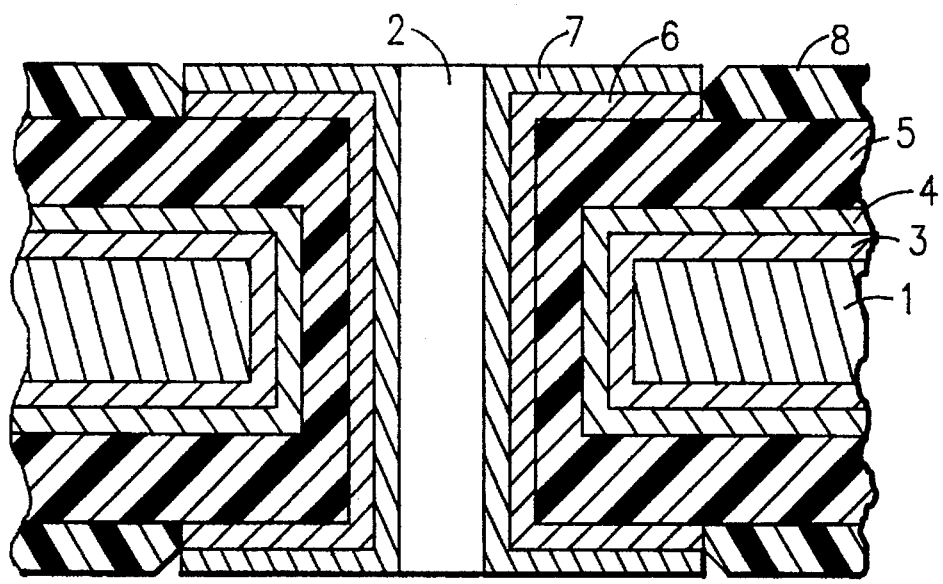
FIG. 1 is a partial sectional view of a printed wiring board in accordance with one embodiment of the invention.

FIG. 1 shows an embodiment of a printed wiring board (PWB) according to one embodiment of the present invention. Formed in the PWB is an aluminum (metal) core 1 having a through hole 2. The surface of the aluminum (Al) core 1 is plated with a nickel (Ni) layer 3 which serves as protection. The surface of Ni layer 3 is covered with a blackened metal (copper) layer 4 as a metal oxide layer for enhancing adhesion. An organic (e.g., resin-impregnated glass fabric known as prepreg) layer 5 as a non-conductive layer is formed over the blackened copper layer 4 and the Ni layer 3.

The copper layer 4, to which a blackening oxidation treatment is applied, enhances the adhesive force between epoxy prepreg layer 5 and the core since it possesses an acicular structure having increased surface area. As described in detail below, to form the blackened copper layer 4, copper plating is first performed and then this blackening oxidation treatment is applied to the copper plated layer. If the Al core 1 is soaked in a strong alkali solution during the copper plating, the core will be eroded by the strong alkali solution. However, since the core is protected by the Ni layer 3, the core is not eroded even by the strong alkali solution. Such protection as afforded by the Ni layer 3 cannot be obtained using an Al oxide layer.

The Ni layer 3 protects the Al core 1 not only from the strong alkali solution, but also from the process in which the copper plated layer is blackened. Further, the Ni layer 3 is firmly linked to the Al core 1 by metallic bonding and is firmly linked also to the copper plated layer. Accordingly, the epoxy prepreg layer 5 can be firmly linked to the Al core 1.

Formed over the epoxy prepreg layer 5 is a copper wiring layer 6 which may serve as a wiring layer in the final board structure. Formed over the copper wiring layer 6 in FIG. 1 is a solder layer 7. The copper wiring layer 6 and the solder layer 7 are also formed inside through hole 2. A solder resist layer 8 is formed over an area of the surface of the epoxy prepreg layer 5 where the copper wiring layer 6 is not formed.

Figure 2:
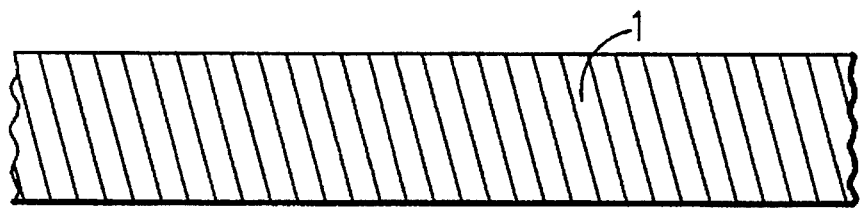
FIG. 2 is a sectional view showing the structure of a metal (e.g., aluminum) core as a metal core for the embodiment of FIG. 1.
Figure 3:
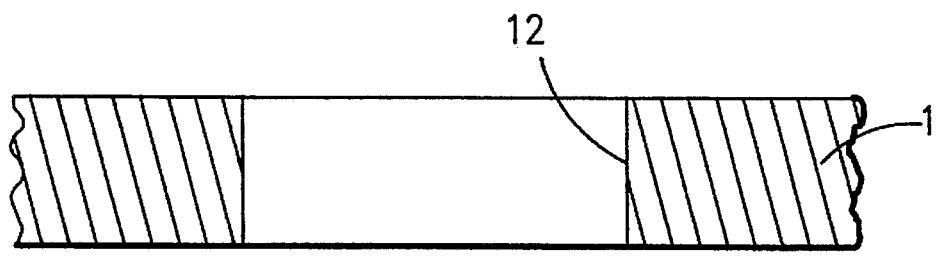
FIG. 3 is a sectional view showing the structure of FIG. 2 in which a through hole is formed in the core.
Figure 4:
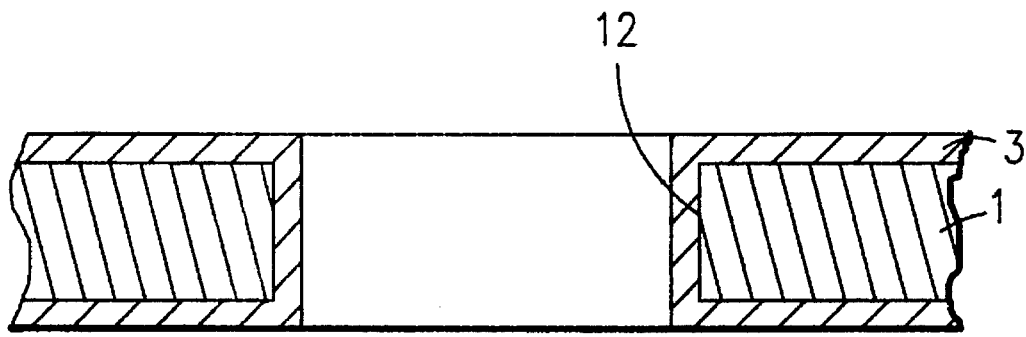
FIG. 4 is a sectional view showing the structure of FIG. 3 in which a second metal (e.g., nickel) layer (for protection) is formed over the metal core.

In the following, an embodiment of a manufacturing method according to the present invention is described. Reference is directed to the sequential steps shown in FIGS. 2–16. By drilling such an Al core 1 as shown in FIG. 2, a pierced bore 12 for a through hole is formed as shown in FIG. 3. Then, as shown in FIG. 4, the Ni layer 3 is formed over the surface of the Al core 1, including the pierced bore 12 for the through hole.

In the following, an example of a method for forming Ni layer 3 is described in detail. First, the Al core 1 is soaked in a degreasing solution to remove grease. For example, the Al core 1 is soaked (e.g., for six minutes), in the solution of "Top Alclean 160" (by OKUNO Chemical Industries Co., Ltd.) whose concentration is 40 to 60 g/l and temperature is 55° to 60° C. The degreased Al core 1 is then washed in water, neutralized, and washed in water again. The neutralization process is performed, for example, by soaking the Al core 1, at the ordinary temperature for one minute, in a 67% nitric acid solution whose concentration is 350 to 450 g/l. Then, if an Al oxide layer is formed over the surface of the Al core 1, this layer is removed by etching the Al core 1. The etching is performed, for example, by soaking the Al core 1, for 30 to 90 seconds, in sodium hydroxide whose concentration is 75 to 100 g/l and temperature is 55° to 60° C.

After the Al oxide layer is removed, the Al core 1 is washed in water, neutralized at nearly the same conditions as above, and washed in water again. Then, the Al core 1 is soaked (e.g., for 20 to 30 seconds) in a solution having a temperature of 20° to 30° C., following which the Al core is washed in water and then washed again, this time by a water shower ("ADD320" by OKUNO Chemical Industries).

The Ni layer 3 is then formed over the surface of the Al core 1, preferably by electroless plating. Used as a plating solution is, for example, one with a Ni concentration of about 5.0 to 5.7 g/l and a pH of about 4.3 to 4.7. Processing time is preferably 8 to 40 minutes, and the processing temperature is 85° to 92° C. For example, "Top Nicoron BL" by OKUNO Chemical Industries, can be used as the plating solution. After the Ni layer 3 is formed over the Al core 1, the Al core 1 is washed in water, washed in hot water, then washed in pure water, and dried (at 80° C. or so).

Figure 5:
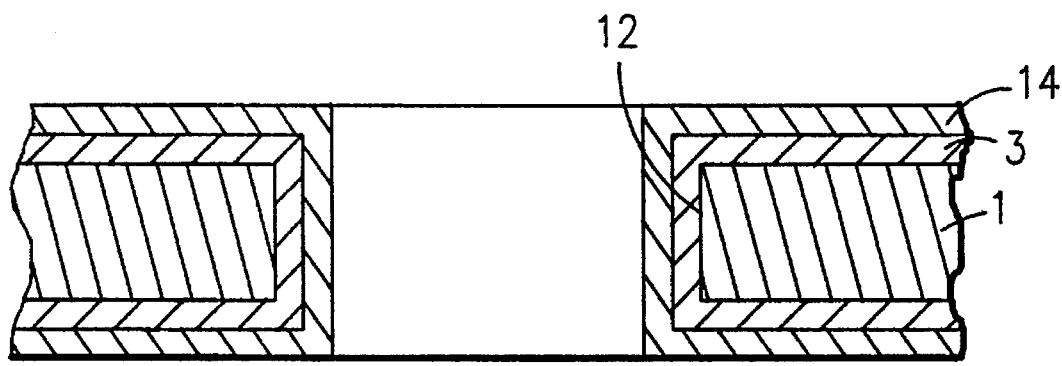
FIG. 5 is a sectional view showing the structure of FIG. 4 in which another metal (e.g., copper) layer is formed over said second metal layer.

As shown in FIG. 5, a copper layer 14 now is formed over the Ni layer 3, preferably by electroless plating. First, however, the Al core 1 is degreased. After the Al core 1 is soaked in a solvent whose processing temperature is 50° to 60° C. to remove any grease thereon, a vapor degreasing step is performed by soaking the Al core in a degreasing solution for four minutes at a processing temperature of about 45° to 55° C. A solvent known as "Trisen" by KANTO DENKA KOGYO Co., Ltd. can be used for this preparative degreasing process. "Ace Clean 5300" by OKUNO Chemical Industries can be used as a degreasing solution for boiling degreasing. After being washed in water, the Al core is electrolytically degreased and then washed, again, in water. The electrolytic degreasing is performed by soaking the Al core in sodium hydroxide having a concentration of about 45 to 55 g/l for two minutes and thirty seconds at the processing temperature of about 30° to 45° C. "Top Cleaner E" by KANTO DENKA KOGYO can be used as sodium hydroxide.

After the electrolytic degreasing process, the Al core 1 is washed in water, soaked in hydrochloric acid, and washed in water again. A 35% hydrochloric acid solution is used for the hydrochloric acid soaking. Then, a cyanogen neutralization process is performed. For the cyanogen neutralization process, free soda cyanide having a concentration of about 40 to 50 g/l is used as the cyanogen neutralizing solution. Then, a strike copper plating process is performed on the Al core. A plating solution used for the strike copper plating comprises sodium carbonate having a concentration of about 100 g/l or less, first copper cyanide with a concentration of about 35 to 45 g/l, and free soda cyanide having a concentration of about 8 to 12 g/l. A processing temperature of about 45° to 55° C. and processing time of about 45 seconds are used.

Following the strike copper plating process, a second copper plating process is performed on the Al core 1. A plating solution used for this copper plating comprises sodium carbonate having a concentration of about 100 g/l or less, first copper cyanide with a concentration of about 60 to 100 g/l, and free soda cyanide having a concentration of about 8 to 10 g/l. A processing temperature of about 50° to 60° C. and processing time of about 8 minutes are used. After this copper plating process, the Al core 1 is washed in water.

Figure 6:
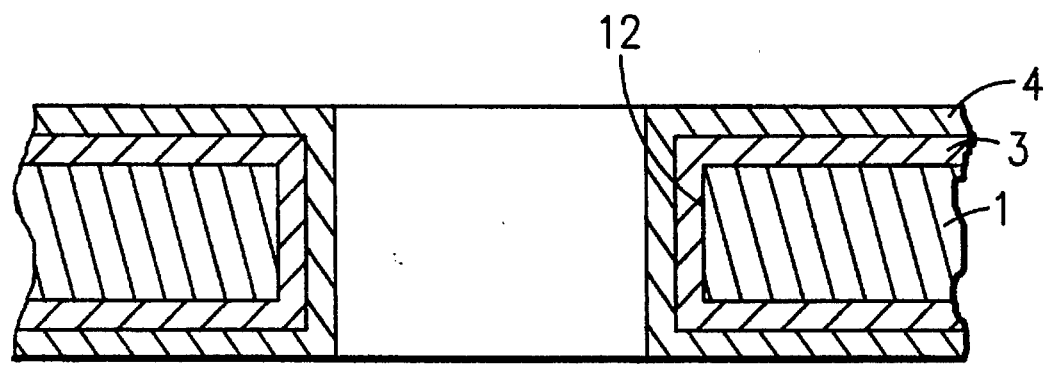
FIG. 6 is a sectional view showing the structure of FIG. 5 in which the added metal (e.g., copper) layer is blackened.
Figure 7:
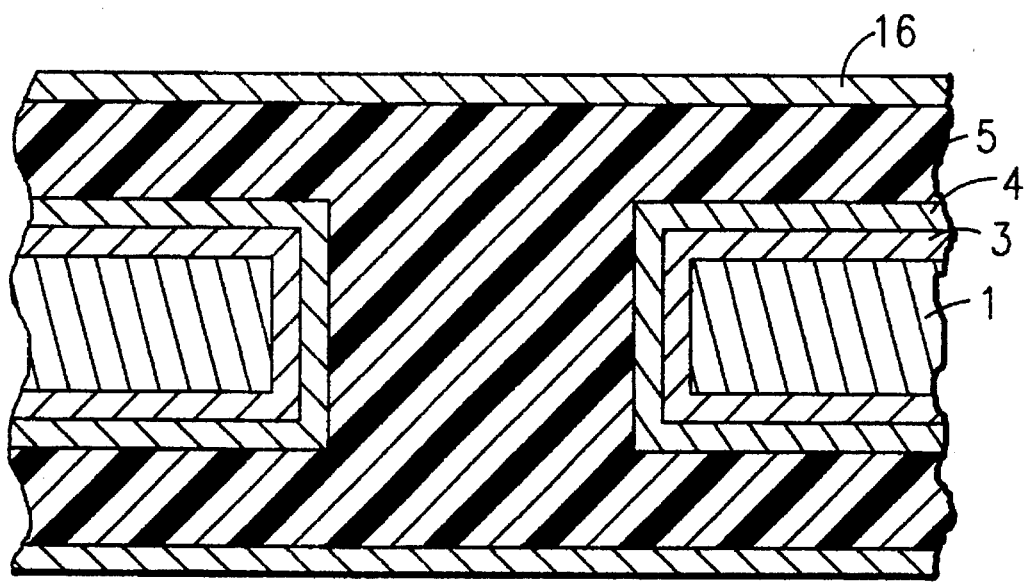
FIG. 7 is a sectional view showing the structure of FIG. 6 in which an organic (e.g., epoxy prepreg) layer and yet another metal (e.g., copper foil) layer are formed over the added (e.g., copper) metal layer.

Copper layer 14 (FIG. 5) is now blackened to form the blackened copper layer 4 as shown in FIG. 6. The blackening treatment of copper layer 14 can be performed in the following way. First, a soft etching process is performed. An etching solution used for this soft etching comprises hydrochloric acid and cupric chloride, used at a processing temperature of about 30° C. and at a processing time of about 1.5 minutes. After this soft etching process, the surface of the copper layer 14 is activated by soaking it, e.g., for 2.5 minutes, in hydrochloric acid at a temperature of about 30° C., following which it is washed in pure water. Then, the copper layer 14 is blackened by processing the Al core 1, for about 3.5 minutes at a temperature of about 60° C., using a processing solution comprised of sodium hydroxide and potassium persulfate. Finally the Al core 1 is dried.

Epoxy prepreg is now applied to both the upper and lower sides of the Al core 1, following which copper foil is added. These are preferably laminated by thermal pressurization, the epoxy prepreg layer 5 and copper thin foil layer 16 as formed being shown in FIG. 7. The pierced bore 12 for this through hole is blocked by epoxy resin which oozes from the epoxy prepreg during the lamination. If an amount of epoxy resin oozed from the epoxy prepreg is not enough to block the pierced bore 12 for the through hole, a predetermined amount of epoxy resin may be previously positioned into the pierced bore 12.

Figure 8:
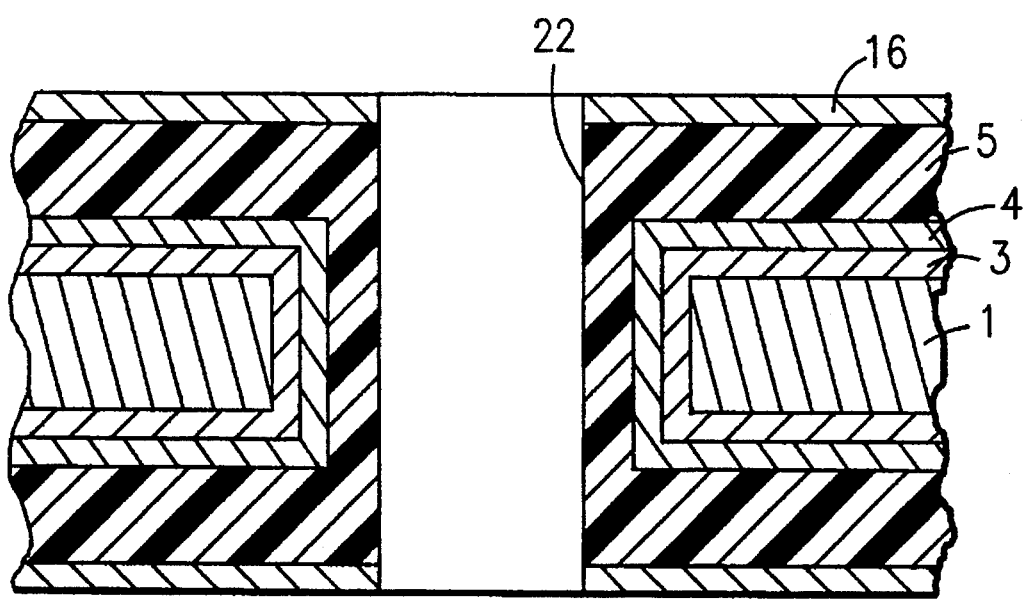
FIG. 8 is a sectional view showing the structure of FIG. 7 in which a through hole has been provided therein.

In FIG. 8, a pierced bore 22 for a through hole is punched in the epoxy prepreg layer 5, preferably by drilling. As an after treatment of drilling using a deburring step, the laminated body may be processed, at a temperature of about 38° C. or less for about five minutes, using a solution called "Mercutizer 9204" provided by Nihon Mukdermit, and then it may be processed, at the temperature of about 75° C. or less for about six minutes using a solution called "Mercutizers 9275 and 9276", by the same company. The body may then be processed, at a temperature of about 43° C. or less for about one minute, using "Mercutizer 9279", by the same company.

Figure 9:
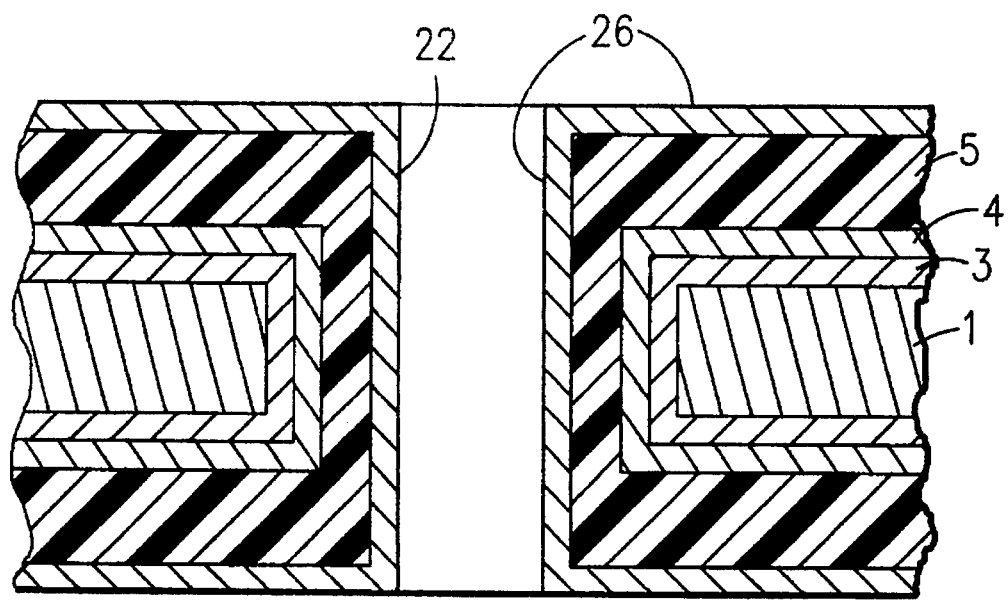
FIG. 9 is a sectional view showing the structure of FIG. 8 in which a thin metal (e.g., copper) layer is added (e.g., plated)

In FIG. 9, a thin copper plated layer 26 is formed by electroless plating on the surface of the laminated body, including, significantly, the pierced bore 22 for the through hole. This electroless plating can be performed in the following way. For example, after the laminated body is degreased using a degreasing solvent such as "CLC 201" by Hitachi Chemical Co., Ltd., soft etching is performed, for about two minutes, to the laminated body using ammonium persulfide at a temperature of about 25° C. The surface is then activated by salt solution at a temperature of about 20° C., processed to improve sensitivity using a solution called "HS-201" by Hitachi Chemical (at 25° C. for six minutes), and processed to improve adhesion by using a solution known as "ADP 301" by Hitachi Chemical (also at 25° C. for six minutes). Then, electroless plating (at 22° C. for 15 minutes) is performed to the surface using "CUST 201" by Hitachi Chemical as an electroless plating solution for the copper, forming a thin copper plated layer 26 over the epoxy prepreg layer 5.

Figure 10:
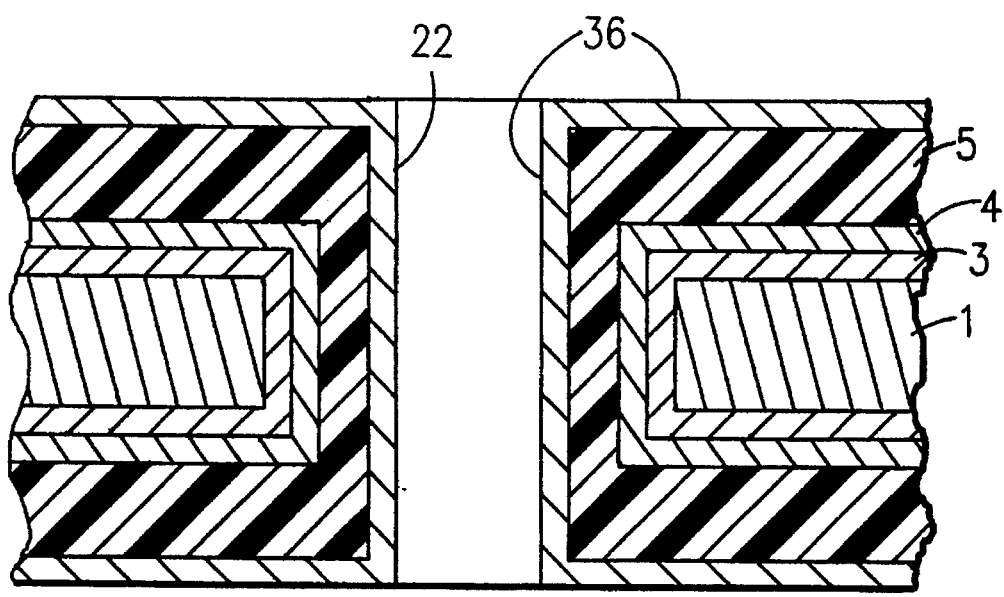
FIG. 10 is a sectional view showing the structure of FIG. 9 in which a thick metal (e.g., copper) layer is plated over the thin plated layer.

In FIG. 10, a thick copper plated layer 36 is formed by electrolytic plating. The electrolytic plating can be performed in the following way. First, after the laminated body is washed (at 25° C. for one minute) using dilute sulfuric acid (concentration of 10%), primary electrolytic plating is performed. For the primary electrolytic plating, for example, a solution known as "PYROBRITEOPY-66 or -67" by C. Uyemura & Co., Ltd. can be used. Its processing temperature is 55° C. and a processing time of four minutes is used. Secondary electrolytic plating is now performed. For the secondary electrolytic plating, for example, "Copperglim PCM" by Meltex can be used as the plating solution. The processing temperature is about 25° C. and a processing time of 30 to 50 minutes is used. Before the secondary electrolytic plating, degreasing process, soft etching, and acid washing steps are performed. "PC 455" by Meltex can be used for the degreasing process (at 30° C. for 4 minutes), "CPE-500" by MITSUBISHI GAS CHEMICAL Co., Ltd. can be used for the soft etching (at 25°·C. for 2 minutes), and dilute sulfuric acid can be used for the acid washing (at 25° C. for 3 minutes).

Figure 11:
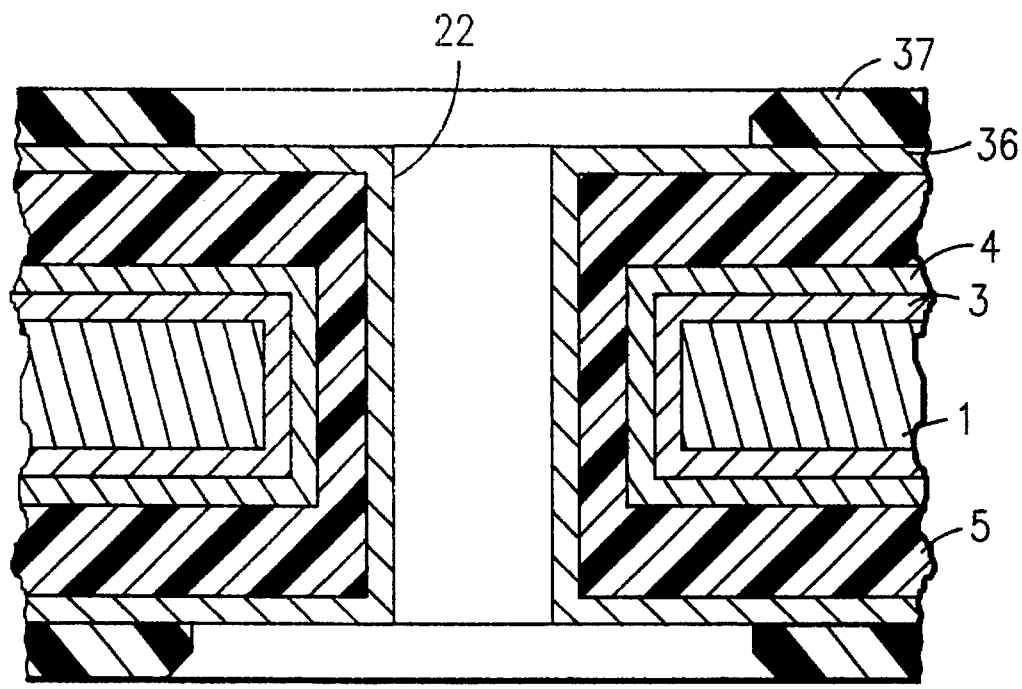
FIG. 11 is a sectional view showing the structure of FIG. 10 in which a dry film masking layer is formed over the thick metal layer.
Figure 12:
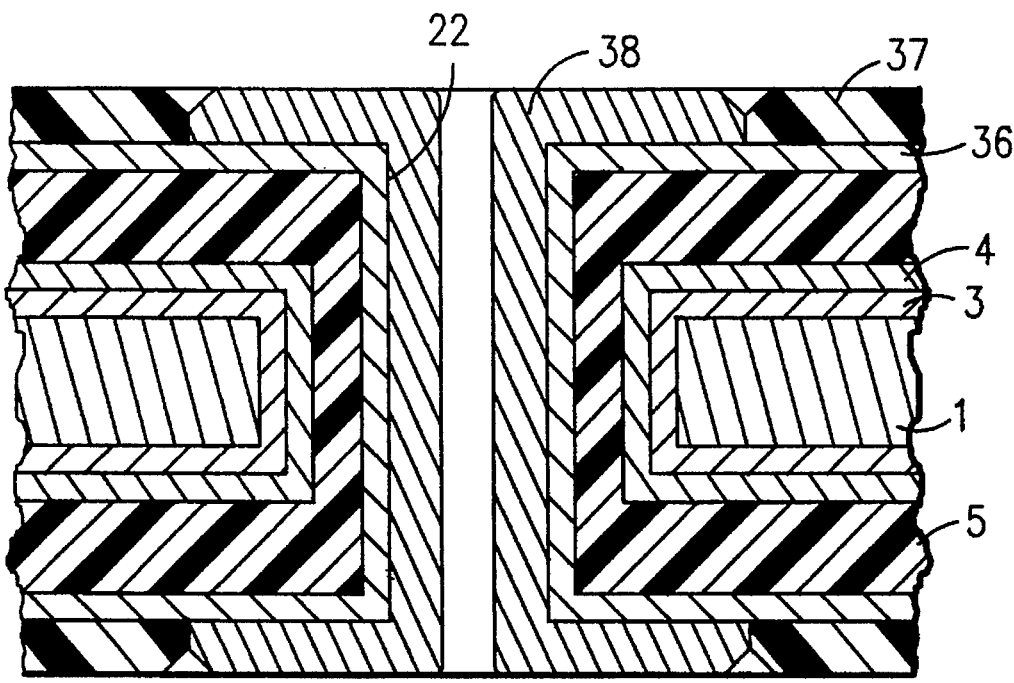
FIG. 12 is a sectional view showing the structure of FIG. 11 in which a solder pattern layer is formed over the thick metal plated layer.

A photosensitive dry film (photo resist) is formed over the copper plated layer 36, the dry film being exposed through a wiring pattern and developed, thus forming a dry film masking layer 37 as shown in FIG. 11. "Lyston Type 1020" by Du Pont de Nemours & Co. can be used as this dry film. As shown in FIG. 12, a solder pattern layer 38 is next formed, by electrolytic plating, over a part which is not masked by the dry film masking layer 37. The solder pattern layer 38 is used as a resist When a wiring pattern of copper is formed by etching the thick copper plated layer 36 later. For the solder plating process, "Plutin LA" by Meltex can be used as a plating solution (at 25° C. for 9 to 12 minutes).

Figure 13:
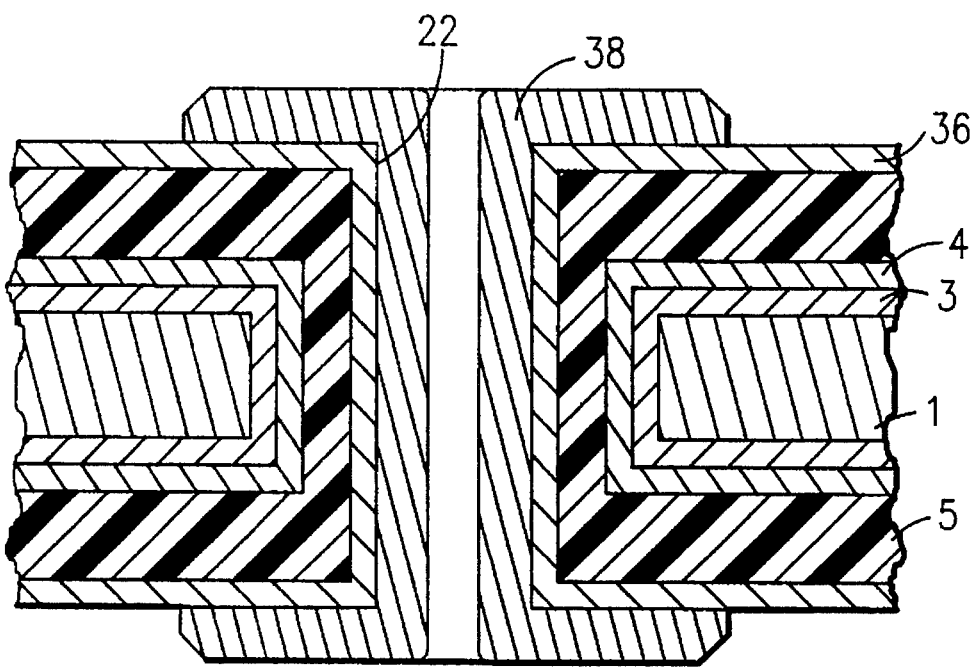
FIG. 13 is a sectional view showing the structure of FIG. 12 in which the dry film masking layer is removed.
Figure 14:
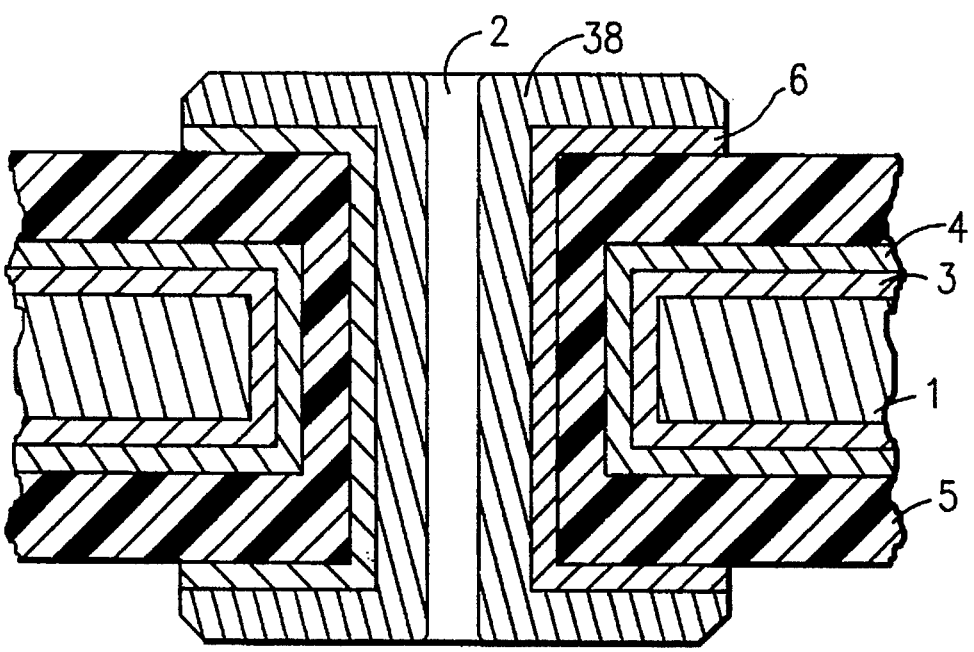
FIG. 14 is a sectional view showing the structure of FIG. 13 in which a portion of the thick plated layer is eliminated from over the organic layer, a portion of this thick plated layer remaining under the solder pattern layer.

In FIG. 13, dry film masking layer 37 is removed using a solvent such as methylene chloride, with only the solder pattern layer 38 left over the copper plated layer 36. "AP-205A" by Tokuyama Soda Co., Ltd. can be used as a solvent for this resist. In FIG. 14, the copper plated layer 36, except the part which is covered with the solder pattern layer 38, is removed (by etching). "A-Process" by Meltex can be used as an etching solvent. A processing temperature of 30° C. and processing time of 50 to 60 seconds are used. The copper wiring layer 6 is left under the solder pattern layer 38 by etching the copper plated layer 36, the solder pattern layer 38 serving as a resist for such etching.

Figure 15:
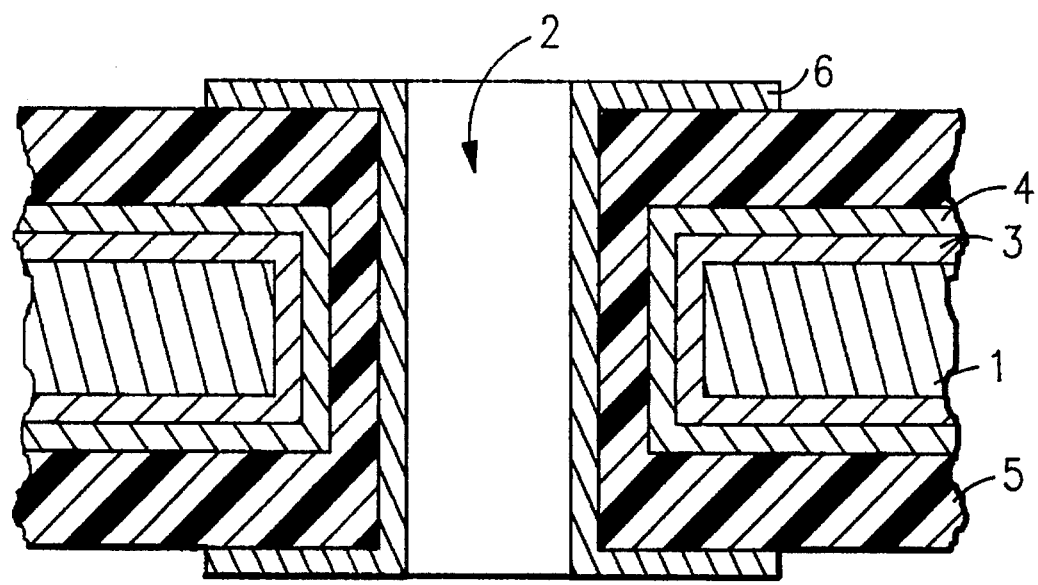
FIG. 15 is a sectional view showing the structure of FIG. 14 in which the solder pattern layer has been removed.
Figure 16:
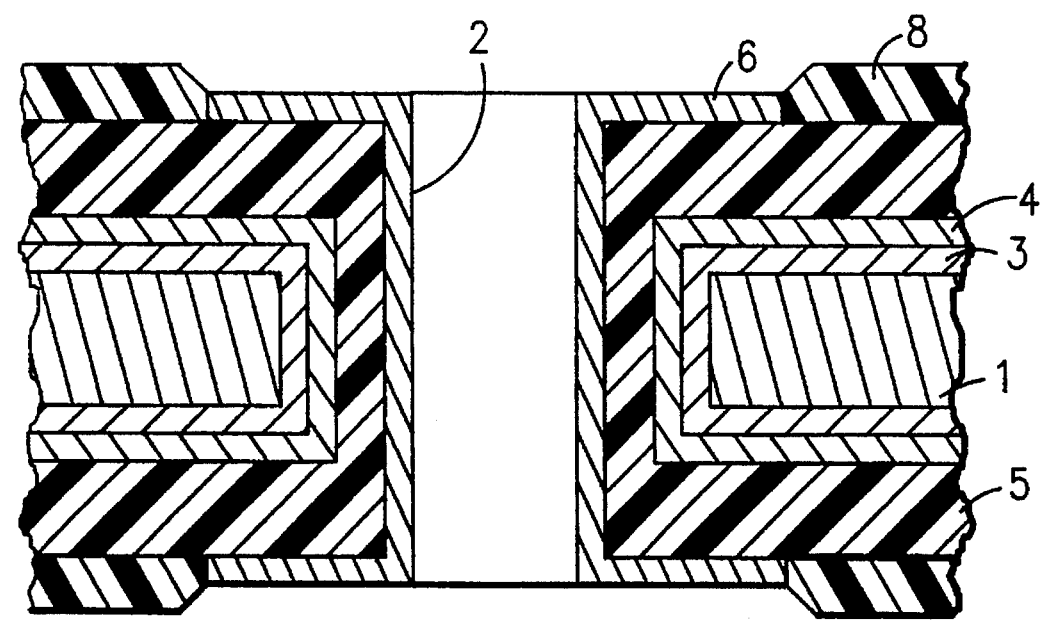
FIG. 16 is a sectional view showing the structure of FIG. 15 in which a solder resist layer is added.

In FIG. 15, the solder pattern layer 38 is removed from the copper wiring layer 36. Such removal of the solder pattern layer 38 is performed by liquefying the solder using an etching solution of a nitric acid series. "S-81" by MEC Co., Ltd. can be used as such an etching solution. A processing temperature of about 40° to 45° C. and processing time of about 80 to 90 seconds are used. Then, as shown in FIG. 16, the solder resist layer 8 is formed over the surface of the epoxy prepreg layer 5, except the part on which the copper wiring layer 36 is formed. The formation of the solder resist layer 8 can be accomplished by applying a photosensitive solder resist solution to the laminated body by printing, exposing it through a wiring pattern, and developing it after the rest of the laminated body is removed.

"CB-530" by Nihon Hyomen Kagaku Co., Ltd. can be used as a solvent for derusting and adherence process, at a processing temperature of about 27° to 30° C. and processing time of 10 seconds or so. The solder resist layer 8 can be formed by applying a photosensitive solder resist solution to the laminated body by printing, exposing it through a wiring pattern, developing it, and performing a hot setting process (for example, at the temperature of 140° C.). "PSR-4000" by TAIYO INK MANUFACTURING Co., Ltd., having a main component of epoxy resin, can be used as a photosensitive solder resist solution. Various marks may be applied on the solder resist layer 8 by silk printing.

In FIG. 1, the solder layer 7 is formed only over the copper wiring layer 6. The solder layer 7 is intended not only to prevent the copper wiring layer 6 from being oxidized, but also to make the soldering to the copper wiring layer 6 easy. When the laminated body is soaked in a soldering solution after the surface of the laminated body is processed by a surface treatment solvent, the solder layer 7 is adherently formed only over the copper wiring layer 6. "CA-91" by MEC can be used as a surface treatment solvent, using a processing temperature of 30° C. and at a processing time of 10 to 20 seconds. "Solcoat H63A (solder)" by Solcoat Inc. can be used as a soldering solution. A flux layer may be formed over the solder layer 7. The flux layer may be formed using, for example, "W-139" flux by MEC.

According to the embodiment as described above, it is possible to use the blackened copper layer 4, having an adhesive behavior which is extremely strong, so as to make the epoxy prepreg layer 5 adhere much better to the Ni layer and thereby over the Al core 1 since the Ni layer 3 can protect the Al core 1 from the attack by the strong alkali solution used during the formation of the copper plated layer 14. Moreover, there is the advantageous result that the Al core is not eroded even in the formation of a printed wiring board having a multilayer structure, which formation necessitates a plurality of copper plating processes, since the Ni layer 3 protects the Al core 1 also from the attack by the strong alkali solution used when the copper wiring layer 6 is formed (by plating). Further, there is an effect that copper plating can be performed directly to the through hole.

Although a core made of aluminum has been defined, it will be appreciated that the present invention may be applied to a case where a core is made of metal other than aluminum, for example, aluminum alloy, magnesium, magnesium alloy, etc. Further, it will be appreciated also that a metal plated layer for protection may be of other metals, for example, chromium, steel, etc. Still further, it will be appreciated that a non-conductive organic layer may be made of organic materials, other than an epoxy prepreg layer.

According to the present invention, it is possible to provide a metal cored printed wiring board and a manufacturing method therefor, in which an organic non-conductive layer does not separate from the metal core even in an environment of high temperature and high humidity since both the metal core and the organic non-conductive layer are firmly adhered. Additionally, copper plating inside the through hole can be easily performed using the teachings herein.

While there have been shown and described what are at present considered the preferred embodiments of the invention, it will be obvious to those skilled in the art that various changes and modifications may be made therein without departing from the scope of the invention defined by the appended claims.

What is claimed is:

1. A method of manufacturing a printed wiring board, comprising the steps of:

providing a metal core;

forming a through hole in said metal core;

plating a first metal layer over said core forming a second metal layer over said plated first metal layer;

blackening said second metal layer;

forming an organic, non-conductive layer over said blackened second metal layer; and forming a wiring layer over said organic non-conductive layer to provide said printed wiring board.

2. The method according to claim 1 wherein said second metal layer is formed by plating.

3. The method according to claim 1 further including subjecting said metal core to an etching process prior to plating said first metal layer over said metal core.

4. The method according to claim 1 wherein said blackening of said second metal layer is accomplished by etching said second metal layer and thereafter processing said second metal layer using a solution of sodium hydroxide and potassium persulfate.

5. The method according to claim 1 wherein said forming of said organic, non-conductive layer is accomplished by lamination.

6. The method according to claim 1 wherein said wiring layer on said organic, non-conductive layer is formed by applying at least two metal layers on said organic, non-conductive layer.

7. The method according to claim 6 wherein said two metal layers are each applied using plating.

8. The method according to claim 1 wherein said first metal layer is formed by plating.

* * * * *